United States Patent
Wischnewskiy et al.

(10) Patent No.: US 9,461,563 B2
(45) Date of Patent: Oct. 4, 2016

(54) ULTRASONIC MOTOR

(71) Applicant: Physik Instrumente (PI) GmbH & Co. KG, Karlsruhe (DE)

(72) Inventors: Wladimir Wischnewskiy, Rathenow (DE); Alexej Wischnewski, Wörth (DE)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 0 days.

(21) Appl. No.: 14/419,373

(22) PCT Filed: May 14, 2014

(86) PCT No.: PCT/DE2014/200215
§ 371 (c)(1),
(2) Date: Feb. 3, 2015

(87) PCT Pub. No.: WO2014/183761
PCT Pub. Date: Nov. 20, 2014

(65) Prior Publication Data
US 2015/0229240 A1 Aug. 13, 2015

(30) Foreign Application Priority Data
May 16, 2013 (DE) .................. 10 2013 105 024

(51) Int. Cl.
*H01L 41/08* (2006.01)
*H02N 2/00* (2006.01)
(Continued)

(52) U.S. Cl.
CPC .......... *H02N 2/103* (2013.01); *H01L 41/0835* (2013.01); *H02N 2/002* (2013.01); *H02N 2/12* (2013.01); *H02N 2/142* (2013.01); *H02N 2/145* (2013.01)

(58) Field of Classification Search
CPC ..... H02N 2/12; H02N 2/142; H01L 41/0835
USPC .................. 310/323.01–323.21, 328
See application file for complete search history.

(56) References Cited

U.S. PATENT DOCUMENTS

| 6,765,335 B2 | 7/2004 | Wischnewskiy |
| 7,218,031 B2 | 5/2007 | Vyshnevskyy et al. |

(Continued)

FOREIGN PATENT DOCUMENTS

| DE | 19522072 C1 | 2/1997 |
| DE | 102008023478 A1 | 5/2009 |

(Continued)

OTHER PUBLICATIONS

International Search Report for application No. PCT/DE2014/200215, dated Sep. 24, 2014, 5 pages.

(Continued)

*Primary Examiner* — Derek Rosenau
(74) *Attorney, Agent, or Firm* — Reising Ethington P.C.

(57) ABSTRACT

An ultrasonic motor having an ultrasound actuator in the form of a piezoelectric hollow cylinder with friction elements on at least one of its end surfaces, and having a rotor in effective contact with the friction elements and an electric excitation device. The actuator is subdivided in the circumferential direction in an even number of sectors Sa and Sb with the sectors Sa and Sb alternating and being adjacent in circumferential direction, and the friction elements being arranged in the range of adjacency of neighboring sectors. Each of the sectors Sa and Sb is formed by exciter electrodes and general electrodes alternatingly arranged in the axial direction of the hollow cylinder, wherein a layer of piezoelectric material is arranged between neighboring excitation electrodes and general electrodes.

10 Claims, 17 Drawing Sheets

(51) Int. Cl.
*H02N 2/10* (2006.01)
*H01L 41/083* (2006.01)
*H02N 2/14* (2006.01)
*H02N 2/12* (2006.01)

(56) References Cited

U.S. PATENT DOCUMENTS

| | | | | |
|---|---|---|---|---|
| 2005/0104476 A1* | 5/2005 | Maruyama | .......... | H01L 41/0835 310/328 |
| 2005/0231140 A1* | 10/2005 | Kataoka | ................ | H02P 25/027 318/114 |
| 2011/0050035 A1* | 3/2011 | Wischnewskiy | ...... | H01L 41/083 310/317 |

FOREIGN PATENT DOCUMENTS

| | | |
|---|---|---|
| DE | 102010022812 A1 | 12/2011 |
| DE | 102012201863 B3 | 5/2013 |
| EP | 0536832 A1 | 4/1993 |
| JP | 2010-028955 A | 2/2010 |

OTHER PUBLICATIONS

Written Opinion for application No. PCT/DE2014/200215, dated Sep. 24, 2014, 6 pages.
DE Office Action for application DE 10 2013 105 024.7, dated Dec. 10, 2013, 2 pages.

* cited by examiner

59

60

61

62

ULTRASONIC MOTOR

TECHNICAL FIELD

The invention relates to an ultrasonic motor according to claims 1 to 11.

BACKGROUND

From the prior art according to references U.S. Pat. No. 6,765,335 B1 or U.S. Pat. No. 7,218,031 B2 ultrasonic motors for a rotation drive are for example known, in which the ultrasound actuator is formed as a piezoelectric hollow cylinder, and in which electrodes are disposed on its circumference surfaces and friction elements are disposed on its end surfaces.

In the case of these ultrasonic motors both the polarization vector p as well as the vector of the electric excitation field E are arranged radially and thus perpendicular to the axial direction of the piezoelectric cylinder. As a result the dynamic force Fad generated by the ultrasound actuator in the axial direction and the dynamic force Ftd generated by the ultrasound actuator in the tangential direction are determined by the same piezomodule d31. In limit cases, these forces can be of identical magnitude.

The drive principle of these ultrasonic motors is based on the transmission of the force generated by the ultrasound actuator to the rotor via an effective or friction contact existing between ultrasound actuator and rotor. Based on this drive principle, the friction force Ffk with regard to the friction contact must always be greater than the amplitude of the dynamic force Ftd. If this is not true, there exists an undesired slip between ultrasound actuator and rotor, which results in a deteriorated function or even malfunction of the ultrasonic motor.

The friction force as a result of the friction contact between ultrasound actuator and rotor is determined by the friction coefficient Kf of the contacting materials and the contact pressure force Fa. For modern hard, non-abrasive materials this coefficient is about 0.2-0.3. For ensuring a linear working range of the friction contact, the condition Ffk=Kf×Fa must be maintained. This means that the friction contact of the ultrasonic motor must comprise the friction force Ffk, and that the friction element is pressed to the friction surface of the rotor by a force Fa=Ffk/0.2-0.3. The contact pressure force Fa must therefore be about 3-5 times greater than the amplitude of the force Ftd. The contact pressure force Fa comprises the static contact pressure force Fas and the dynamic contact pressure force Fad, with the force Fas being generated by a spring. For the optimum function of the friction contact, the static contact pressure force Fas must be equal to the amplitude of the dynamic contact pressure force Fad.

In the ultrasonic motors known from the prior art, the actuator develops both the force Fad acting in the axial direction and the force Ftd acting in the tangential direction. This can be explained by the fact that both forces are determined by the same piezomodule d31. Accordingly, in these motors the amplitude of the contact pressure force Fa can only be twice larger than the amplitude of the force Ftd.

Accordingly, the friction force Ffk in friction contact is also limited and together with it the maximum force obtainable by the ultrasonic motor is also limited, so that with the ultrasonic motors known from the prior art it is not possible to generate the nominally obtainable maximum forces achievable with the piezoelectric parameters.

Moreover very high mechanical losses in friction contact (slip) are created with these ultrasonic motors under high loads.

Apart from this, such motors require a comparatively high excitation voltage, whereby the losses in the actuators are increased.

All of these effects together result in heating of the actuators and in a corresponding reduction of the maximum operating temperature. Altogether the ultrasonic motors known from the prior art according to references U.S. Pat. No. 6,765,335 B1 or U.S. Pat. No. 7,218,031 B2 present a comparatively low efficiency.

SUMMARY

It is therefore an object of the invention to provide an ultrasonic motor that overcomes the drawbacks of the ultrasonic motors according to the prior art named above, and in particular to provide an ultrasonic motor having high effectivity or a high efficiency.

This object is achieved by an ultrasonic motor according to claim 1, with the subsequent subclaims comprising at least expedient embodiments and further developments.

Accordingly, this starts out from an ultrasonic motor comprising an ultrasound actuator in the form of a piezoelectric hollow cylinder having an inner circumferential surface and an outer circumferential surface and end surfaces interconnecting the inner and outer circumferential surfaces, wherein friction elements are disposed on at least one end surface. The ultrasonic motor furthermore comprises a rotor in effective contact with the friction elements comprising at least one disc or a platform, as well as an electric excitation device.

The ultrasound actuator is subdivided along its circumference, or in circumferential direction, into an even number of sectors Sa and Sb, with each sector being characterized by its geometrical dimensions L, H and T. L designates the mean length of the sector, i.e. in the circumferential direction of the hollow cylinder in the middle between external and internal circumference. H designates the height of the sector in the direction of the longitudinal or rotation axis of the hollow cylinder (axial direction), and T designates the thickness of the sector, i.e. the distance between inner and outer circumferential surfaces in radial direction. The mean length L accordingly is the length of the sector in circumferential direction at half the thickness T, i.e. at T/2. All the sectors Sa together form the sector group A, while all the sectors Sb together form the sector group B. Each sector Sa is joined by two sectors Sb at two sides opposite in the circumferential direction, and each sector Sb is joined in the same way by two sectors Sa, so that the sectors Sa and Sb of the two sector groups A and B alternate and join each other in the circumferential direction. In the range of the limit surface between two neighboring sectors Sa and Sb, i.e. in the range of adjacency of neighboring sectors, the friction elements are arranged.

Each of the sectors Sa and Sb is formed by excitation electrodes and general electrodes alternatingly arranged in the axial direction of the hollow cylinder, with a layer of piezoelectric material being arranged between neighboring excitation electrodes and general electrodes, and all the excitation electrodes and all the general electrodes of the ultrasound actuator being electrically connected to each other.

Owing to an electric voltage applied to the excitation electrodes and the general electrodes via the electric excitation device the electric field E forms between them, with the vector of the electric field E coinciding with the direction of the longitudinal or rotation axis of the ultrasound actuator. Owing to the inverse piezoelectric effect, the electric field E generates the force Fad in the direction of the longitudinal or rotation axis, and the force Ftd in the tangential direction.

The force Fad comprises the static contact pressure force Fas, whereby the force Fa is formed which presses the friction element to the rotor. The force Fa acts contrary to the elasticity force Fs of the friction contact. The force Ftd causes the rotor to move contrary to the force Fr.

In harmony with theory, the piezoelectric force Fad is proportional to the piezomodule d33, and the force Ftd is proportional to the piezomodule d31.

With hard PZT ceramic, the ratio of d33/d31 is in the range between 2.5 and 3. This means that the actuator 1 of the ultrasonic motor of the invention develops a dynamic force Fad acting in axial direction (i.e., along the longitudinal or rotation axis) that is 2.5 to 3 times greater than the force Ftd developed in tangential direction.

From the condition for an optimal function of the friction contact, according to which the static contact pressure force Fas has to be equal to the amplitude of the dynamic force Fad, it follows that in this case the entire contact pressure force has to be equal to double the amplitude of the dynamic contact pressure force Fad. This means that when this condition is maintained in the proposed motor, the contact pressure force Fa is 5-6 Ftd. I.e., when an electric voltage is applied to the excitation electrodes and general electrodes, the contact pressure force Fa, which is 5 to 6 times greater than the amplitude of the tangential force Ftd, is created in the friction contact of the ultrasonic motor according to the invention.

In accordance with the above explanations, the friction contact of the ultrasonic motor of the invention is characterized by a friction force Ffk in the friction contact which is 2.5 to 3 times greater than is true for the motors of the prior art according to references U.S. Pat. No. 6,765,335 B2 and U.S. Pat. No. 7,218,031 B2 mentioned above. This allows it to develop considerably greater maximum forces compared to the ultrasonic motors according to U.S. Pat. No. 6,765,335 B2 or U.S. Pat. No. 7,218,031 B2, and a slip within the friction contact at high tensile forces is substantially reduced or even avoided. Altogether, the result is an ultrasonic motor having high tensile force and simultaneously low losses and thus low self heating.

Hereinafter, the expressions 'hollow cylinder' and 'cylinder', 'ultrasound actuator' and 'actuator', and 'ultrasonic motor' and 'motor' are used synonymously.

It can be advantageous that the excitation electrodes and the general electrodes and the layers of piezoelectric material arranged between excitation electrodes and general electrodes of the sectors of a group of sectors form a generator for acoustic longitudinal standing waves, and the generators thus formed are drivable electrically in such a way that a first longitudinal standing wave expands along the generatrix of the ultrasound actuator, and a second acoustic longitudinal standing wave expands along the height of the ultrasound actuator. The expansion along the generatrix of the ultrasound actuator should here and also hereinafter be understood in the sense of the longitudinal standing wave expanding in circumferential direction.

Furthermore it can be advantageous that the excitation electrodes and the general electrodes and the respective layers of piezoelectric material arranged between neighboring excitation electrodes and general electrodes of the sectors of a group of sectors form a generator for an acoustic asymmetric standing wave, and the generators thus formed are electrically drivable in such a way that the acoustic asymmetric standing waves expand along the generatrix of the ultrasound actuator.

It can furthermore be advantageous that the ratio of L to H is between 1 and 1.3, and that the ratio of H to T is between 2 and 20. This results in an ultrasonic motor that can be operated particularly effectively.

It can also be advantageous that the rotor comprises damping elements, which reduce the amplitude of parasitic vibrations of the rotor.

It can furthermore be advantageous that the electric excitation device provides an electric single-phase excitation voltage, and the electric excitation device comprises a commutator for applying the single-phase excitation voltage to the excitation electrodes and the general electrodes of either the first or the second group for reversing the direction of rotation of the rotor.

In addition it can be advantageous that the electric excitation device provides an electric two-phase voltage, wherein one of the voltages U1 and U2 thus provided is applied to the excitation electrodes and the general electrodes of a sector group, and the second one of the voltages thus provided is applied to the excitation electrodes and the general electrodes of the other sector group, and the electric excitation device comprises a commutator for phase shift between the provided voltages U1 and U2 for reversing the direction of rotation of the rotor.

It can moreover be advantageous that compensation inductivities Lk, which partially or completely compensate the capacitive component of the current of the electrodes of a sector group or of both sector groups, are connected in parallel with the excitation electrodes and the general electrodes of a sector group or in parallel with the excitation electrodes and the general electrodes of both sector groups.

It can also be advantageous that the electric excitation device comprises a feedback element that is connected in series with the electrodes of one of the sector groups.

Here it can in particular be advantageous that the electric excitation device comprises a feedback circuit for controlling the frequency of the excitation voltage after the phase signal of the feedback element.

In addition it can be advantageous that the ultrasonic motor comprises a position or velocity indicator of the rotor and a controller for position and velocity of the rotor.

BRIEF DESCRIPTION OF THE DRAWINGS

Further advantageous embodiments of the ultrasonic motor result from combinations of the features disclosed in the claims, in the description and in the drawings.

Short description of the drawings.

DETAILED DESCRIPTION

Figure 1:
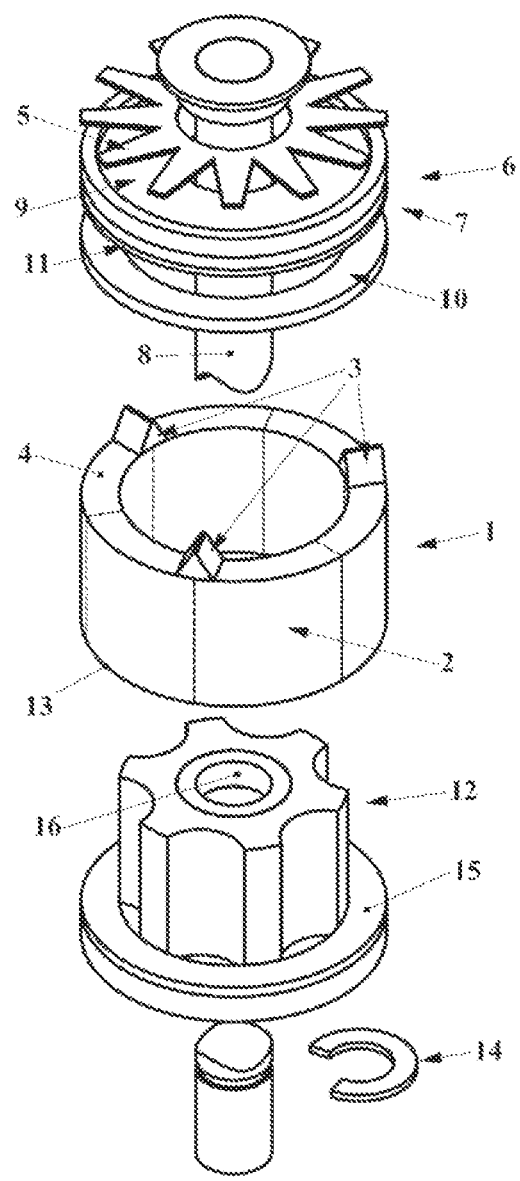
FIG. 1: Exploded view of an ultrasonic motor according to the invention.

FIG. 1 clarifies the structure of a possible embodiment of the ultrasonic motor according to the invention via an exploded view.

It comprises an ultrasound actuator 1 formed as a piezoelectric hollow cylinder 2. At one of the end surfaces 4 of the ultrasound actuator, three friction elements 3 are disposed in a mutually equal circumferential distance. The rotor 6 is pressed against the friction elements 3 with the aid of a spring 5, with the rotor being formed as a multi-part disc 7 connected to the axis 8.

The multi-part disc 7 comprises the mount 9, the friction rail 10, and the damping element 11, located between the mount 9 and the friction rail 10. The damping element 11 is formed as an elastic bonding agent. Apart from this it is conceivable to execute the damping element, e.g., as a rubber ring or as a viscous layer enriched with solid particles. The friction rail 10 consists of an oxide ceramic based on $Al_2O_3$ with $ZrO_2$ as an addition. Other oxide ceramics or other hard, non-abrasive materials such as non-oxide-ceramics, e.g. silicium carbide, boron carbide, silicium nitride, aluminum nitride, boron nitride, etc. are equally conceivable for this.

The ultrasound actuator 1 is disposed in the mount 12. By its second end surface 13, at which no friction elements are disposed, the actuator 1 supports itself on the sound-insulating base 15. The mount 12 comprises a ball bearing 16 in which the axis 5 turns. The rotor 6 is held by the holding element 14.

Figure 2:
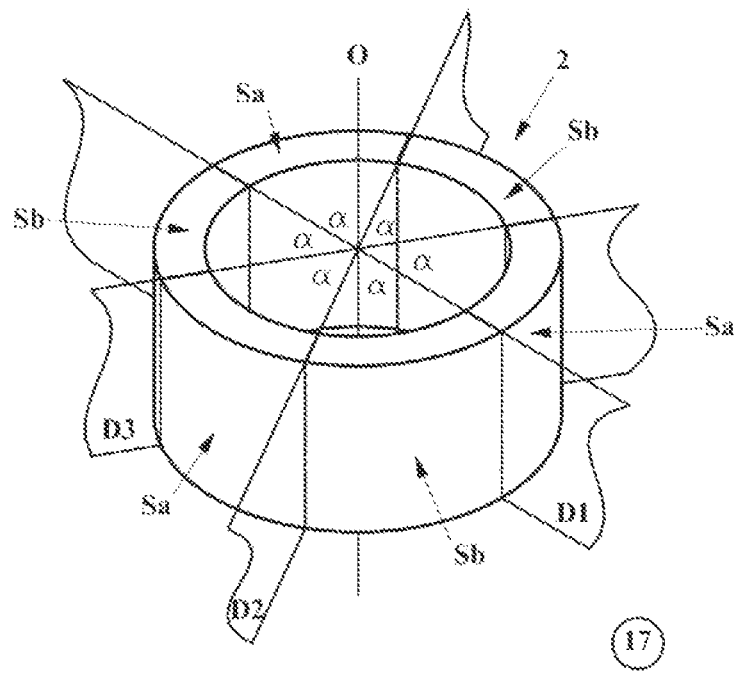
FIG. 2: Representation 17: Three-dimensional view of an ultrasound actuator of an ultrasonic motor according to the invention; representation 18: top view of the ultrasound actuator according to representation 17.
Figure 2:
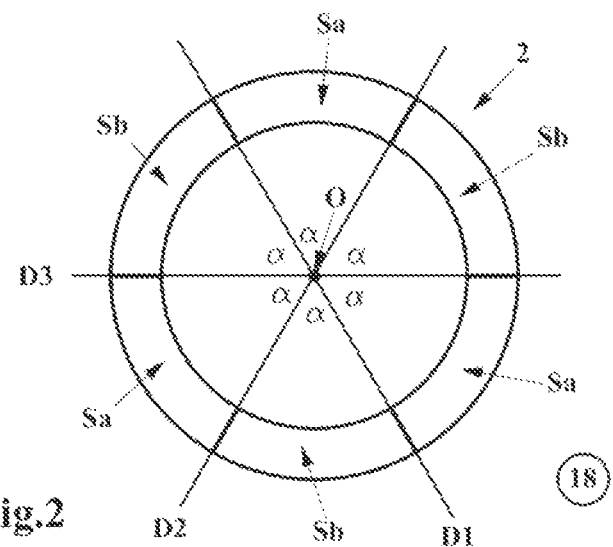

According to FIG. 2, the piezoelectric cylinder 2 can be subdivided by axial-diametral planes—here, for example, by the three axial-diametral planes D1, D2 and D3—into an even number of equal sectors (hollow cylinder segments) Sa and Sb, with all the sectors Sa forming a sector group A and all the sectors Sb forming a sector group B. The sectors Sa and the sectors Sb are alternatingly arranged along the circumference of the hollow cylindrical ultrasound actuator and are adjacent each other.

The axial-diametral planes D1, D2 and D3 are formed by the longitudinal or rotation axis O of the cylinder 2 and one of its parameters. The expression equality of the sectors Sa and Sb is understood to mean that the axial-diametral planes D1, D2 and D3 divide the cylinder into the sectors Sa and Sn with the same circumferential angle α.

The number of the axial-diametral planes dividing the cylinder 2 of the actuator 1 can be chosen at will, e.g. n.

Figure 3:
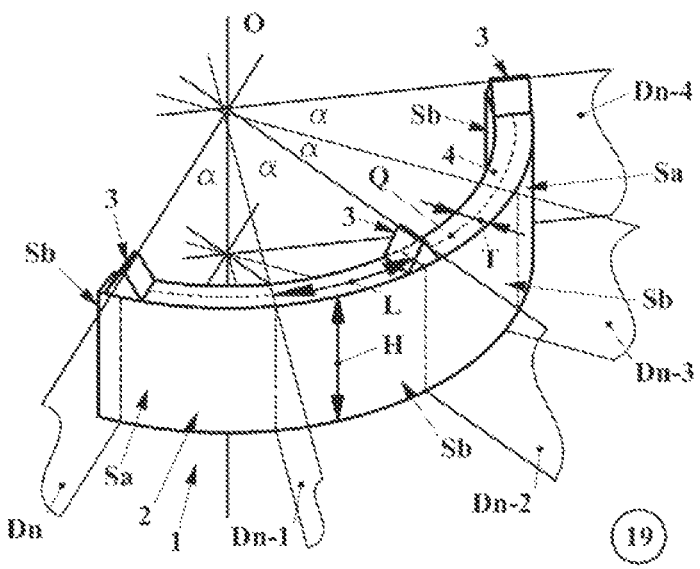
FIG. 3: Representation 19: Three-dimensional view of a portion of an ultrasound actuator of an ultrasonic motor according to the invention with friction elements at one of the end surfaces; representation 20: three-dimensional view of a portion of an ultrasound actuator of an ultrasonic motor according to the invention with friction elements at both end surfaces.
Figure 3:
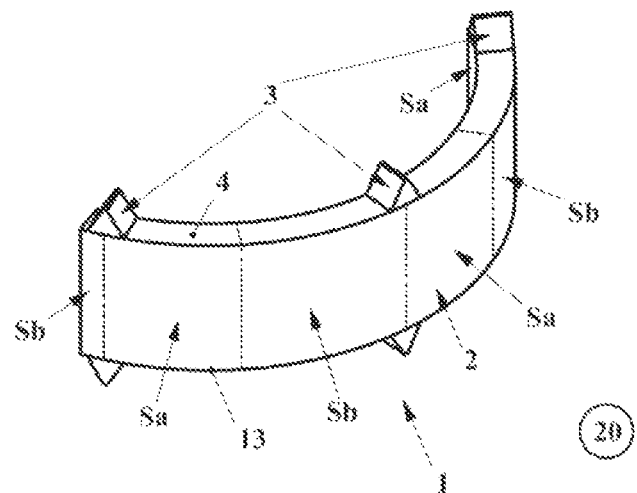
Figure 4:
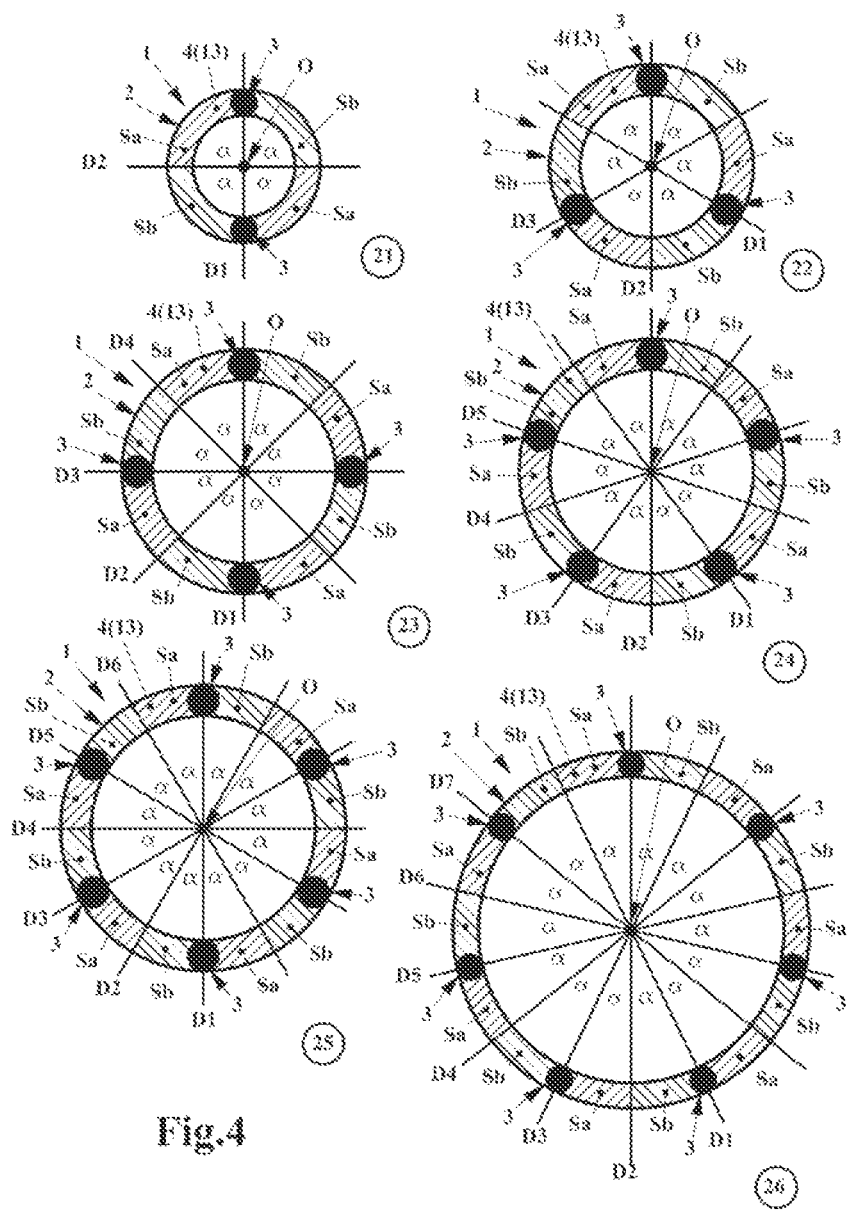
FIG. 4: Representations 21 to 26: top views of ultrasound actuators of an ultrasonic motor according to the invention with a different number of friction elements arranged thereon.

Representation 19 of FIG. 3 shows a part of the hollow-cylindrical ultrasound actuator 1, with the latter being subdivided into n axial-diametral planes. The (circumferential) angle α of the sectors Sa and Sb for such an ultrasound actuator is 360/2n=180/n.

In the ultrasound actuator 1 of the ultrasonic motor according to the invention, the piezoelectric hollow cylinder 2 comprises the generatrix Q. Further geometrical dimensions of the hollow cylindrical ultrasound actuator or of its sectors Sa or Sb are: the mean length L of the sector Sa or Sb, the height H in the direction of the longitudinal or rotation axis O and the wall thickness T in the radial direction. The mean length L here is the length of the sector in the circumferential direction at position T/2. The length of the generatrix Q is therefore the sum of the lengths of all the sectors Sa and Sb, i.e. Q=nL.

The friction elements 3 are arranged on the end surface 4 of the cylinder 2 in the range of the border of two adjoining sectors Sa and Sb (sector pair), namely, symmetrically with respect to the sector pair separated by the respective axial-diametral plane D.

According to representation 20 of FIG. 3, the friction elements 3 can also be arranged on both end surfaces 4 of the ultrasound actuator 2.

In representations 21 to 26, ultrasound actuators are shown in top views which comprise two, three, four, five, six and seven friction elements 3. Here the friction elements are made of the oxide ceramic $Al_2O_3$ but can also be of other hard and non-abrasive materials, e.g. of the oxide ceramic $ZrO_2$ or of a non-oxide ceramic such as SiC or $Si_3N_4$. They can, however, also be made of solid monocrystals such as, e.g., sapphire, ruby, corundum. Moreover they can also be made of metal ceramic on the basis of tungsten carbide, titanium carbide and similar. The friction elements can moreover be produced from different kinds of hard polymer materials and be filled with hard non-abrasive particles such as, e.g., aluminum oxide, zirconium oxide, tungsten carbide, titanium carbide and similar.

Figure 5:
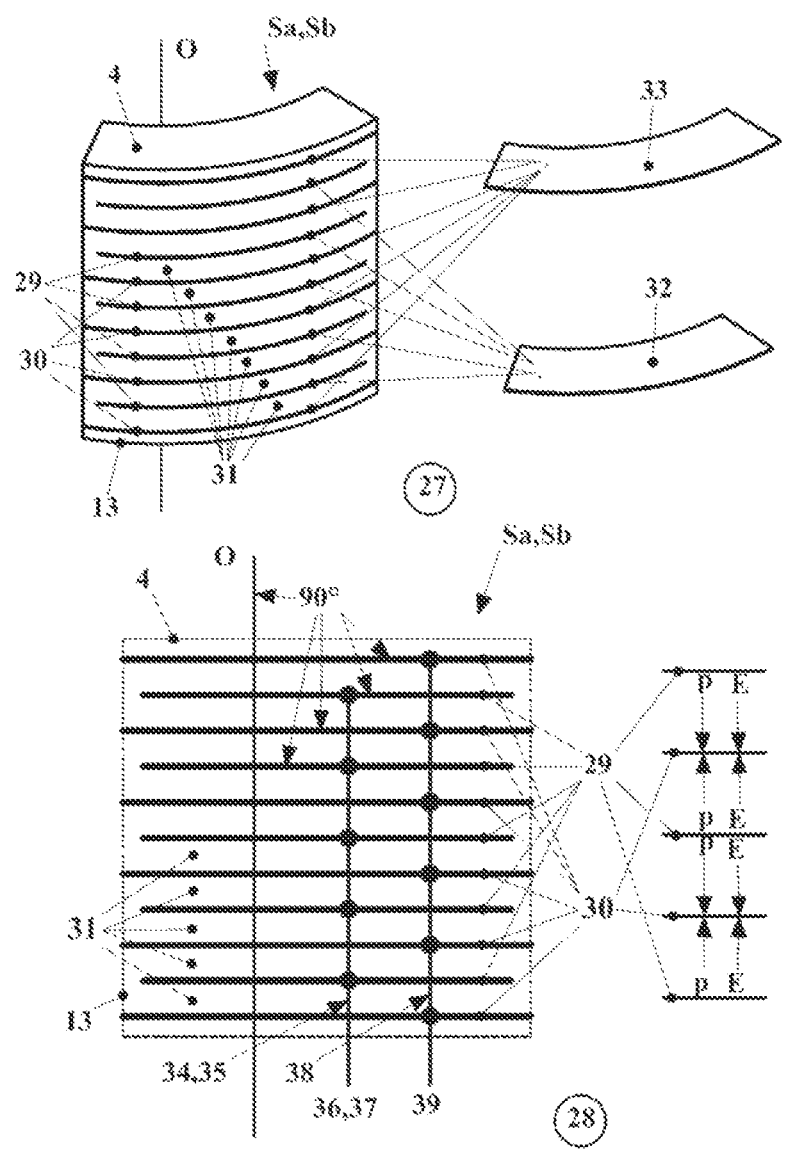
FIG. 5: Representation 27: Inner construction of a sector of an ultrasound actuator of an ultrasonic motor according to the invention in three-dimensional view; representation 28: inner construction of the sector according to representation 27 in lateral view and with representation of the electrical connections.

According to FIG. 5 each sector Sa or Sb of each sector group A and B comprises layers of excitation electrodes 29 and general electrodes 30 alternatingly arranged in axial direction, with one piezoceramic layer 31 being arranged between every neighboring excitation electrode 29 and general electrode 30.

The layers of the excitation electrodes 29 are here formed of segments 32, and the layers of general electrodes 30 are formed of segments 33.

The layers of electrodes 29, 30 comprise thin palladium layers having thicknesses between 10 and 150 micrometers. It is, however, equally conceivable that the layers of electrodes 29, 30 comprise thin palladium-silver layers or thin copper layers. The piezoceramic layers 31 comprise a hard PZT-piezoceramic with a thickness between 30 and 50 micrometers. The production of the ultrasound actuator is here achieved by means of a piezoceramic multilayer technology, however a production by synthesis of piezoceramic in air or in protective gas is equally possible.

In every sector Sa and Sb the layers 29, 30, 31 are arranged perpendicularly, i.e. at an angle of 90° to the longitudinal or rotation axis O of the cylinder 2 and thus in parallel to the end surfaces 4, 13 of the cylinder.

The piezoceramic layers 31 are polarized perpendicularly to the electrodes 29, 30 (in representation 28 of FIG. 5 characterized by arrows having the index p). With such a polarization the polarization vector p is directed parallel to the longitudinal or rotation axis of the cylinder 2 and perpendicular to its end surfaces 4, 13.

All the layers of excitation electrodes 29 belonging to the sectors Sa of the sector group A are electrically connected to each other. Likewise, all the layers of excitation electrodes 29 belonging to the sectors Sb of the sector group B are electrically connected to each other. Moreover all the layers of general electrodes 30 of the sectors Sa and sectors Sb of sector groups A and B are electrically connected to each other.

Here, in each sector Sa and Sb all the layers of excitation electrodes are connected to each other by means of the conductive tracks 34 and 35 and with the connections 36 and 37, and all the layers of the general electrodes 30 are connected to each other with the aid of the conductive tracks 38 with the connections 39.

With this kind of connection of the electrodes, the following two limit cases are conceivable:

In the first case, the excitation electrodes 29 together with the general electrodes 30 and the piezoceramic layers 31 between all the sectors Sa belonging to sector group A form the first combined generator for an acoustic longitudinal standing wave (i.e., an acoustic longitudinal standing wave expanding in the circumferential direction) expanding along the generatrix Q of the piezoelectric cylinder 2 of the ultrasound actuator 1 and for an acoustic longitudinal standing wave expanding along the height H or the height expansion of the piezoelectric cylinder 2 of the ultrasound actuator 1. The excitation electrodes 29 together with the general electrodes 30 and the piezoceramic layers 31 between them of all the sectors Sb belonging to the sector group B form the second combined generator for an acoustic longitudinal standing wave expanding along the generatrix Q of the piezoelectric cylinder 2 of the ultrasound actuator 1 or an acoustic longitudinal standing wave expanding in circumferential direction, and for an acoustic longitudinal standing wave expanding along the height H of the piezoelectric cylinder 2 of the ultrasound actuator 1 or an acoustic longitudinal standing wave expanding in direction of the height.

In the second case, the excitation electrodes 29 together with the general electrodes 30 and the piezoceramic layers 31 between them all the sectors Sa belonging to the sector group A form the first generator for an asymmetric acoustic longitudinal standing wave expanding along the generatrix Q of the piezoelectric cylinder 2 of the ultrasound actuator 1. The excitation electrodes 29 together with the general electrodes 30 and the piezoceramic layers 31 between them all the sectors Sb belonging to the sector group B form the second generator for an asymmetric acoustic longitudinal standing wave expanding along the generatrix Q of the piezoelectric cylinder 2 of the ultrasound actuator 1.

Figure 6:
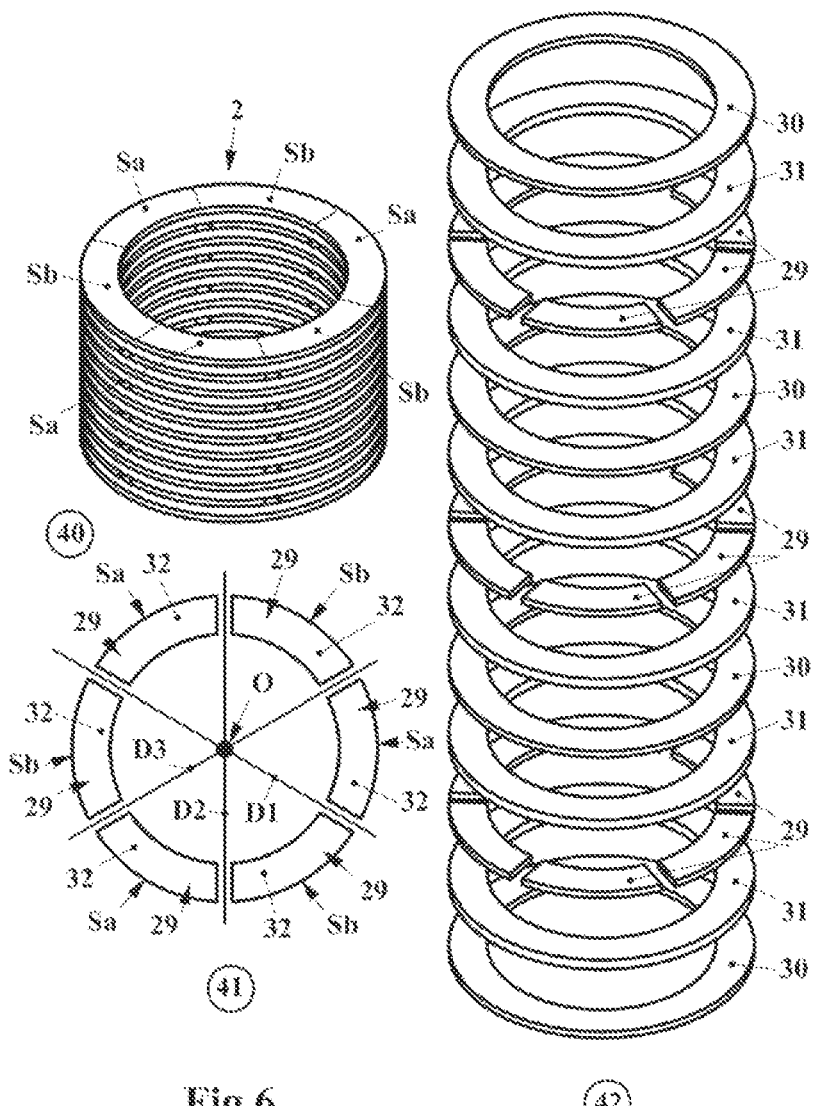
FIG. 6; Representation 40: Three-dimensional view of an ultrasound actuator of an ultrasonic motor according to the invention; representation 41: top view of a layer of excitation electrodes of the ultrasound actuator according to representation 40 formed as circle ring segments; representation 42: explosion view of the ultrasound actuator according to representation 40.

According to representation 41 of FIG. 6, the excitation electrodes 29 of the hollow cylindrical ultrasound actuator according to representation 40 of FIG. 6 are formed as segments 32 and the general electrodes 30 according to representation 42 as rings which cross all the sectors Sa and Sb of both sector groups A and B.

Figure 7:
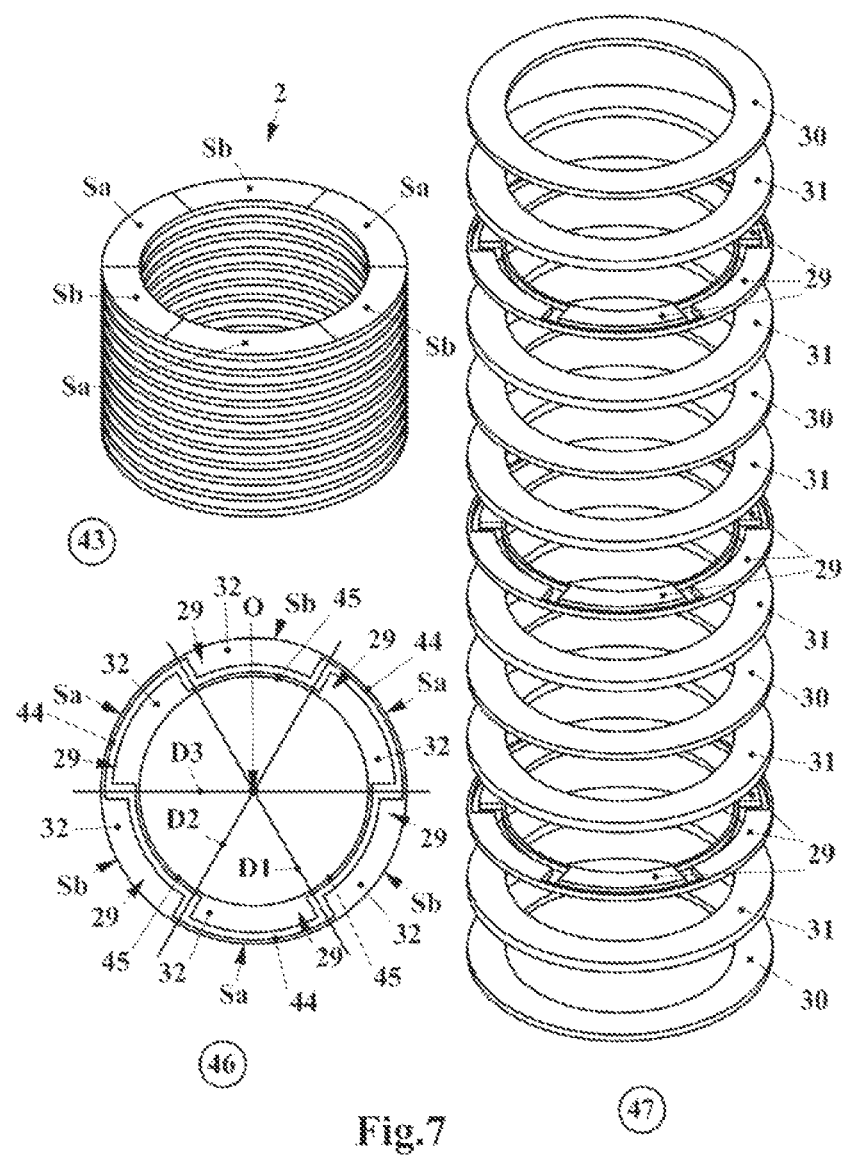
FIG. 7: Representation 43: Three-dimensional view of an ultrasound actuator of an ultrasonic motor according to the invention; representation 46: top view of a layer of excitation electrodes of the ultrasound actuator according to representation 43; representation 47: Exploded view of the ultrasound actuator according to representation 43.

According to representation 46 of FIG. 7, the excitation electrodes 29 of the hollow cylindrical ultrasound actuator according to representation 43 are formed as segments 32 that are connected with the electrically conducting tracks 44 and 45. The tracks 44 connect the electrodes 29 of the sectors Sa to each other, while the tracks 45 connect the electrodes 29 of the sectors Sb to each other.

Figure 8:
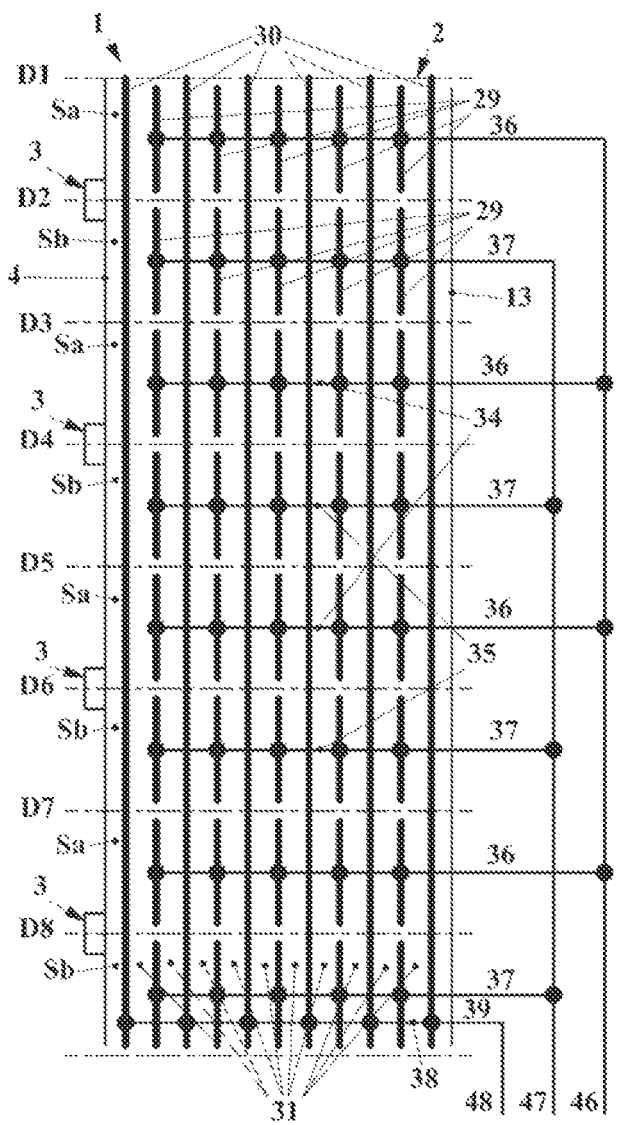
FIG. 8: Representation of an embodiment of the electric contacting of the electrodes of an ultrasound actuator of an ultrasonic motor according to the invention in the form of an unwound jacket surface section of the ultrasound actuator.

According to FIG. 8, in which a part of the unwound jacket surface of an ultrasound actuator of an ultrasonic motor according to the invention with the electrodes 29, 30 on it is shown schematically, all the excitation electrodes 29 of the sectors Sa of sector group A are connected to the conductive tracks 34 via the connections 36 to the output 46 of the electrodes of sector group A, while all the excitation electrodes 29 of sectors Sb of the sector group B are connected with the conductive tracks 35 via the connections 37 to the output 47 of the electrodes of the sector group B. All general electrodes 30 are connected with the electrically conductive tracks 38 via the connection 39 to the output 48 of sector groups A and B.

Figure 9:
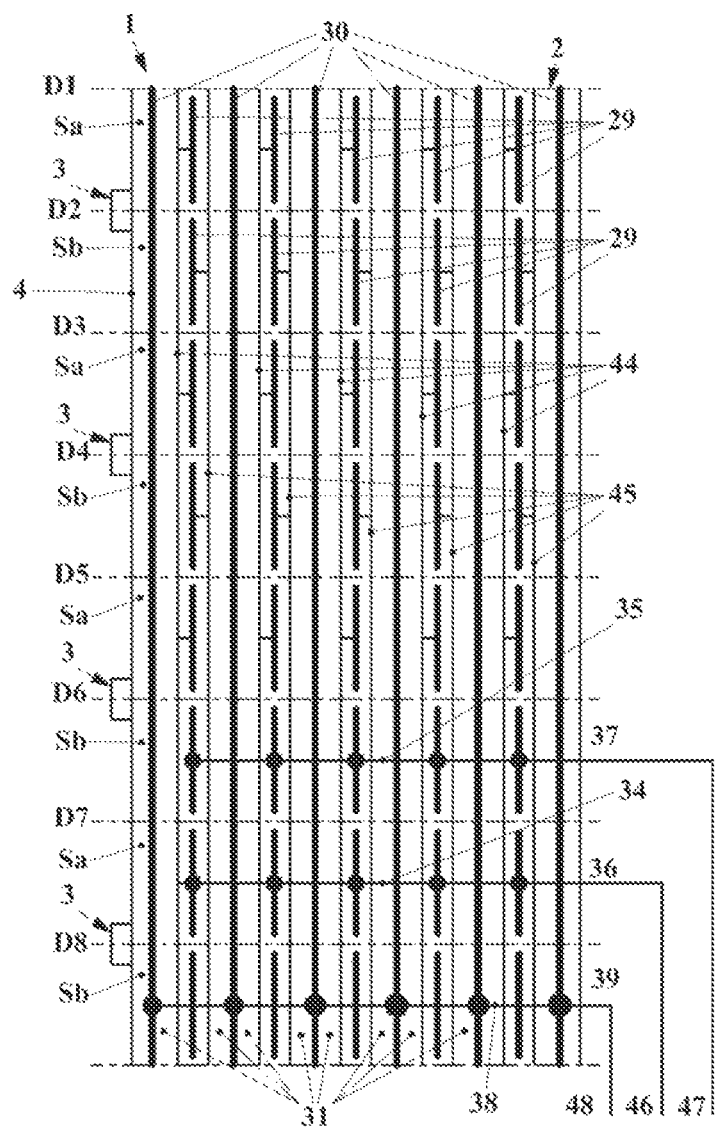
FIG. 9: Representation of another embodiment of the electric contacting of the electrodes of an ultrasound actuator of an ultrasonic motor according to the invention in the form of an unwound jacket surface section of the ultrasound actuator.

According to FIG. 9, in which a part of the unwound jacket surface of another embodiment of an ultrasound actuator of an ultrasonic motor according to the invention with the electrodes 29, 30 on it is shown schematically, all the excitation electrodes 29 of the sectors Sa of sector groups A with the conductive tracks 34 are connected via the connections 36 to the output 46 of the electrodes of sector group A. All the excitation electrodes 29 of sectors Sb of sector group B are connected with the conductive tracks 45 via the connections 37 to the output 47 of sector group B, and all the general electrodes 30 are connected with the electrically conductive tracks 38 via the connection 38 with the output 48 of sector groups A and B.

Figure 10:
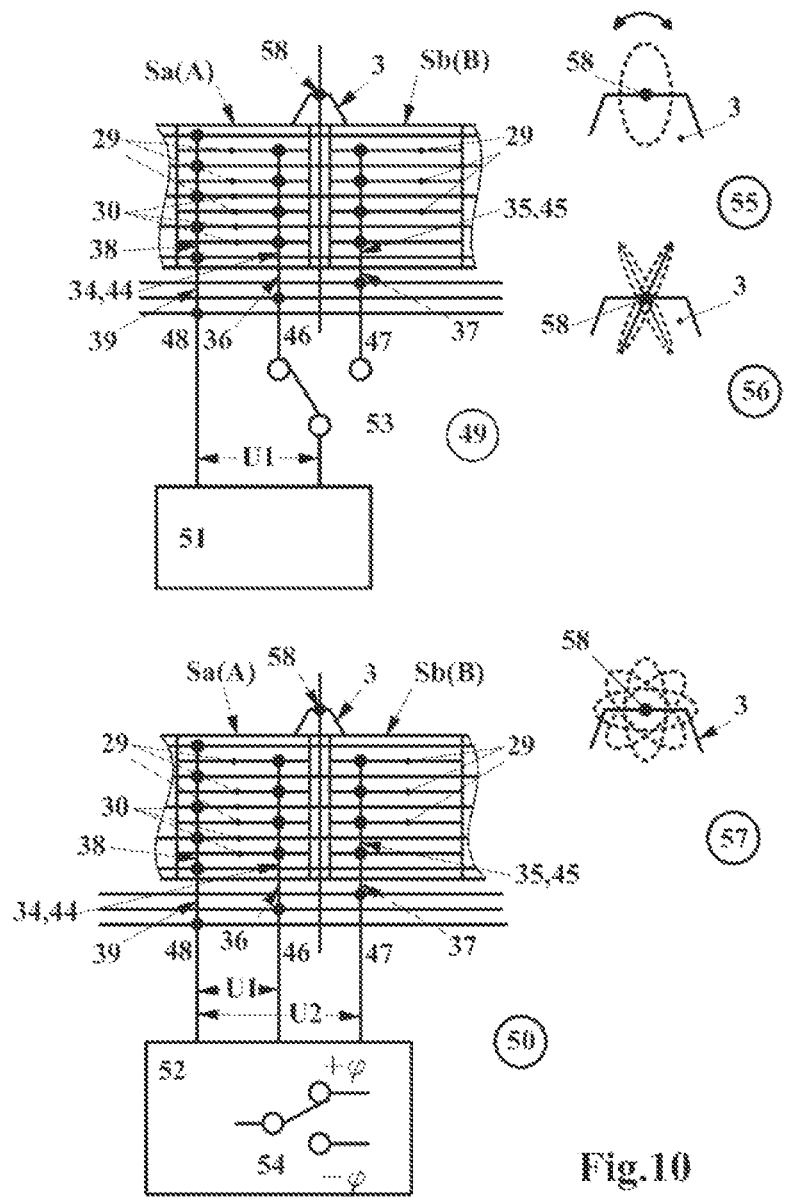
FIG. 10: Representations 49 and 50: Different embodiments of a circuit for connecting the excitation electrodes and the general electrodes of sectors Sa and Sb of an ultrasound actuator with an electric excitation device of the ultrasonic motor according to the invention; representations 55 to 57: Different possible movement paths of a point of a friction element of an ultrasonic motor according to the invention.

Representations 49 and 50 of FIG. 10 show different circuit variants for connecting the excitation electrodes 29 and the general electrodes 30 of sectors Sa and Sb with the electric excitation device 51 or 52.

The electric excitation device 51 here provides a single-phase electric voltage U1. This voltage is applied with the aid of commutator 53 to the electrodes 29 and 30 of all sectors Sa of the sector group A or to electrodes 29 and 30 of sectors Sb of sector group B.

The electric excitation group 52, on the other hand, provides a two-phase electric voltage U1, U2 with a phase shift φ between the voltages U1, U2. The voltage U1 is applied to the electrodes 29, 30 of all sectors Sa of sector group A. The voltage U2 is applied to the electrodes 29, 30 of all sectors Sb of sector group B.

The electric excitation device 52 comprises a phase commutator 54 which can be used to change the phase shift from Plus φ to Minus φ.

The voltages U1, U2 can comprise a sinusoidal, a triangular, a sawtooth-shape, a rectangular shape or any other shape, where the frequency f0 of the first harmonic of these voltages corresponds to the frequency of the acoustic longitudinal standing wave expanding along the generatrix Q of the piezoelectric cylinder 2 of the actuator 1, and the frequency f0 corresponds to the acoustic longitudinal standing wave expanding along the height H of the piezoelectric cylinder 2 of the actuator 1.

Moreover the frequency f0 can correspond to the frequency of the acoustic asymmetric longitudinal standing wave expanding along the generatrix Q of the piezoelectric cylinder of the rotor 1.

When the excitation voltage U1 is applied to the excitation electrodes 29 and to the general electrodes 30 of sectors Sa and Sb, the first or the second generator for acoustic waves is excited. The generators can be switched over with the commutator 53.

For the function of the actuator 1, two limit cases are conceivable. These principles are considered below for free oscillations of the actuator 1:

In the first case, the voltage U1 in the actuator 1 simultaneously produces two symmetrical acoustic waves, namely an acoustic longitudinal standing wave expanding along the generatrix Q of the piezoelectric cylinder 2, and an acoustic longitudinal standing wave expanding along the height H of the piezoelectric cylinder 2. In this case the first and the second generators operate like combined generators for two types of acoustic waves.

Due to the overlay of the two types of acoustic waves the points 58 arranged on the friction surfaces of the friction elements 3 move on the elliptic movement track shown by the dotted line according to representation 55 of FIG. 10. When the commutator 53 is activated, the movement direction of the points 58 reverses. This changes the movement direction of the rotor 6.

In the second case, the voltage U1 in the actuator 1 generates an asymmetric acoustic wave that expands along the generatrix Q of the piezoelectric cylinder 2. Through the propagation of this wave, the points 58 arranged on the friction surfaces of the friction elements 3 move along the inclined linear movement track (shown by the dotted line according to representation 56 of FIG. 10), or on a stretched elliptical movement track. When the commutator 53 is activated, the inclination of the movement track towards the friction surface of the friction element 3 is reversed.

The selection of the one or the other functional principle can be effected by selecting the corresponding ratio of L/H or the corresponding frequency f0.

In the event of a two-phase excitation of the actuator 1, the two excitation voltages U1 and U2 are simultaneously applied to the excitation electrodes 29 and the general electrodes 30 of sectors Sa and Sb. As a result, the first and the second generator for the acoustic waves are excited simultaneously. This kind of excitation enables any desired shape and any desired inclination of the elliptic movement track of points 58, clarified by the dotted line in representation 57 of FIG. 10. The change of shape and inclination of the movement track can be brought about by changing the amplitude of the voltages U1, U2 and the phase shift angle φ. By activating the commutator 54 it is possible to change the phase shift angle from Plus φ to Minus φ. Hereby the rotation direction of the rotor 6 is changed.

Figure 11:
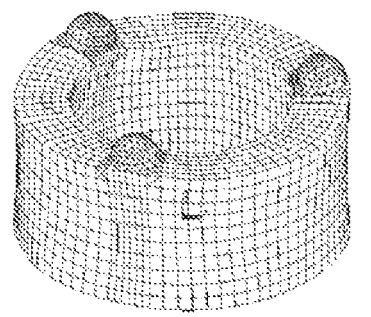
FIG. 11: Representations 59 to 62: four phases of maximum deformation of an unloaded ultrasound actuator of an ultrasonic motor according to the invention with particular dimensions in case of its one-phase excitation and a certain frequency of the excitation voltage.
Figure 11:
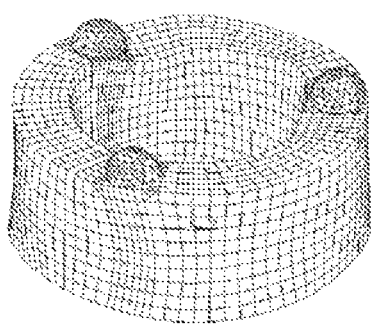
Figure 11:
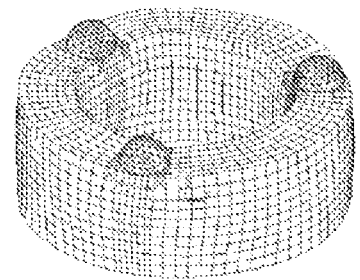
Figure 11:
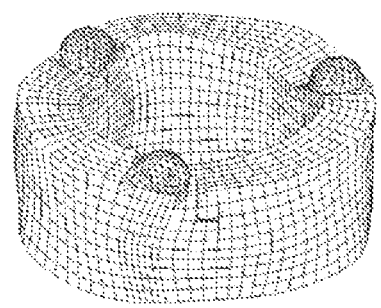

The representations 59 to 62 of FIG. 11 show four phases of maximum deformation of the unloaded actuator 1 having the form of a hollow cylinder with the dimensions ⌊14× ⌊10×6 mm in the case of its single-phase excitation and the frequency of the excitation voltage of f0=289.2 kHz.

Figure 12:
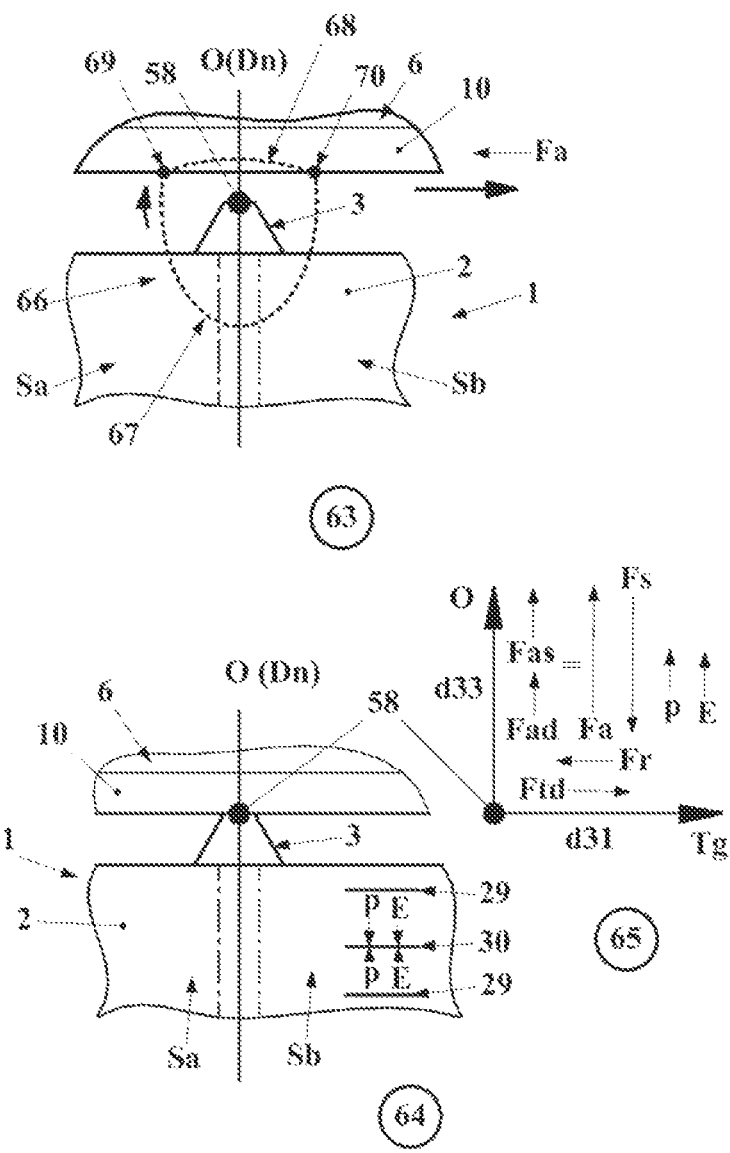
FIG. 12: Representations 63 and 64: meshing or contact conditions between friction element and rotor at different points of time; representation 65: clarification of the forces acting between friction element and rotor according to meshing ratio according to representation 64.

The representations 63 to 65 of FIG. 12 serve for explaining the functional principle of the friction contact for an ultrasonic motor according to the invention at a maximum load Fr acting on the friction element 3 from the side of the rotor 6. When operated at maximum load, it is assumed that the rotor 6 is being decelerated with the force Fr and moves with a speed considerably smaller than its maximum speed, with no slip appearing yet between friction element 3 and friction rail in friction contact.

With this functional principle, the points 58 on the friction surface of the friction element 3 move on the movement track 66 according to representation 63 of FIG. 12.

The movement track 66 comprises two characteristic portions 67 and 68 situated between the points 69 and 70. In portion 67, the friction element 3 is not in contact with the friction rail 10, i.e. the actuator 1 is unloaded. In portion 68, the friction element 3 is pressed to the friction rail 10. The actuator 1 is applied with the force Fr via the rotor 6.

Representation 64 of FIG. 12 clarifies the movement of the friction element 3 in portion 68.

Representation 65 of FIG. 12 shows the forces acting on the friction contact of the motor when the friction element 3 is moving in portion 68 of the movement track 66.

Due to the electric voltages U1 or U2 applied to the electrodes 29 and 30, the electric field E forms between them. Representations 64 and 65 of FIG. 12 show the vector of the electric field E, the direction of which coincides with the one of the polarization vector p and the direction of the longitudinal or rotation axis.

Due to the reversed piezoelectric effect, the electric field E generates the force Fad in the direction of the longitudinal or rotation axis, and the force Ftd in the direction of the tangential axis Tg. In portion 68 of the movement track 66, these forces are at their maximum.

The force Fad comprises the static force Fas, which brings about the force Fa, pressing the friction element 3 to the friction rail 10. The force Fa acts opposite to the elasticity force of the friction contact Fs. The force Ftd causes the rotor 6 to move contrary to the force Fr.

The piezoelectric force Fad is here proportional to the piezomodule d33, and the force Ftd is proportional to the piezomodule d31.

In the case of a hard PZT ceramic, the ratio of d33/d31 lies in the range between 2.5 and 3. This means that the actuator 1 of the ultrasonic motor according to the invention develops a dynamic force Fad acting in the axial direction (i.e., along the longitudinal or rotation axis) that is 2.5 to 3 times greater than the force Ftd developed in the tangential direction (along axis Tg).

It follows from the condition for an optimum function of the friction contact, according to which the static contact pressure force Fas has to be equal to the amplitude of the dynamic force Fad, that in this case the entire contact pressure force Fa has to be equal to double the amplitude of the dynamic contact pressure force Fad. This means that when this condition is maintained in the proposed motor, the contact pressure force Fa is 5-6 Ftd. I.e., when the electric voltage is applied to the electrodes 29 and 30, the contact pressure force Fa, which is 5 to 6 times greater than the amplitude of the tangential force Ftd, is generated in the friction contact of the ultrasonic motor according to the invention.

According to the above representations, the friction contact of the ultrasonic motor according to the invention is characterized by a friction force Ffk in the friction contact that is 2.5 to 3 times greater than is true for the motors according to the prior art according to references U.S. Pat. No. 6,765,335 B2 and U.S. Pat. No. 7,218,031 B2 mentioned at the beginning. This allows it to develop considerably higher maximum forces in comparison with the ultrasonic motors according to U.S. Pat. No. 6,765,335 B2 or U.S. Pat. No. 7,218,031 B2.

Figure 13:
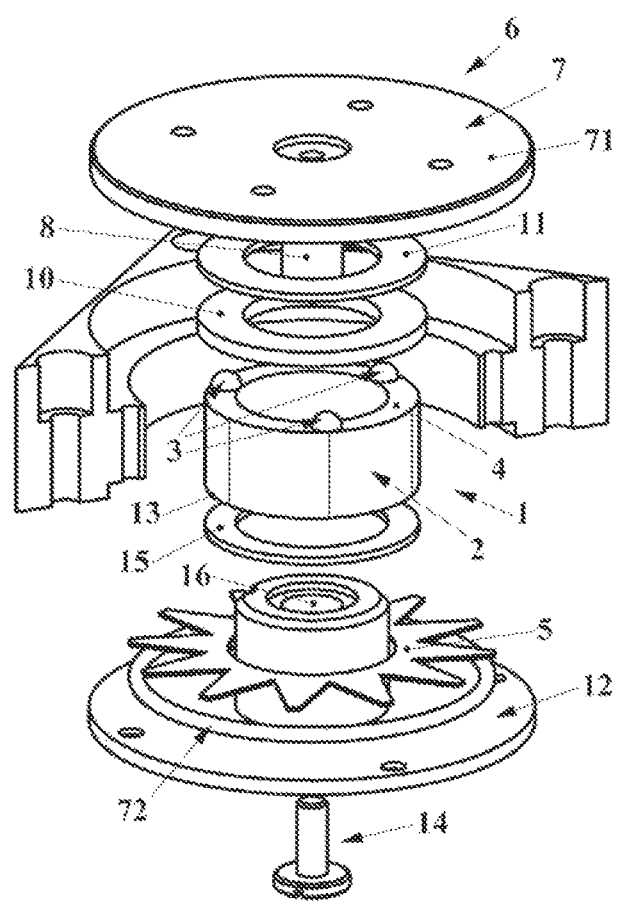
FIG. 13: Exploded view of an ultrasonic motor according to the invention.

FIG. 13 shows an ultrasonic motor formed as a work table. The rotor 6 of this motor consists of the platform 71 which is fixedly mounted on the axis 8. On the platform 71, the friction rail 10 is fastened with the damping element 11. The spring 5 presses the friction elements 3 of the ultrasound actuator 1 to the friction rail 10; this is achieved by way of the sound-insulating base 15 and the end surface 13 of the piezoelectric ring 2, supported on the stop ring 72.

Figure 14:
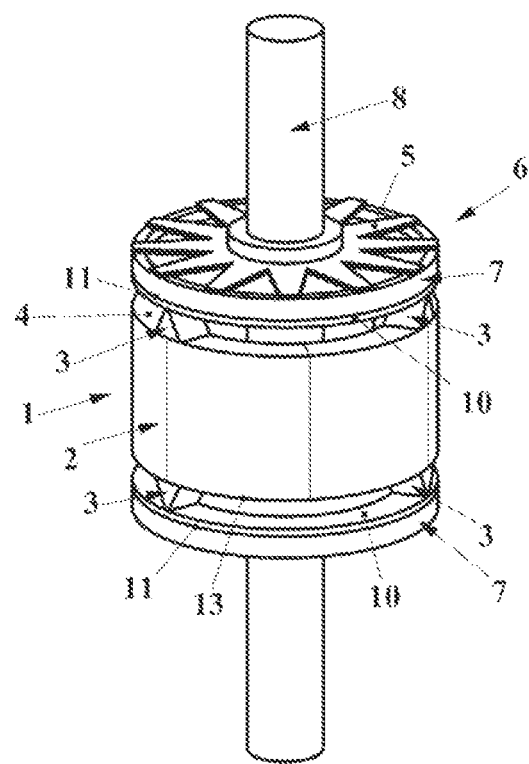
FIG. 14: Further embodiment of an ultrasonic motor according to the invention.

FIG. 14 shows an embodiment of the ultrasonic motor according to the invention, in which the rotor 6 comprises two assembled discs 7.

Figure 15:
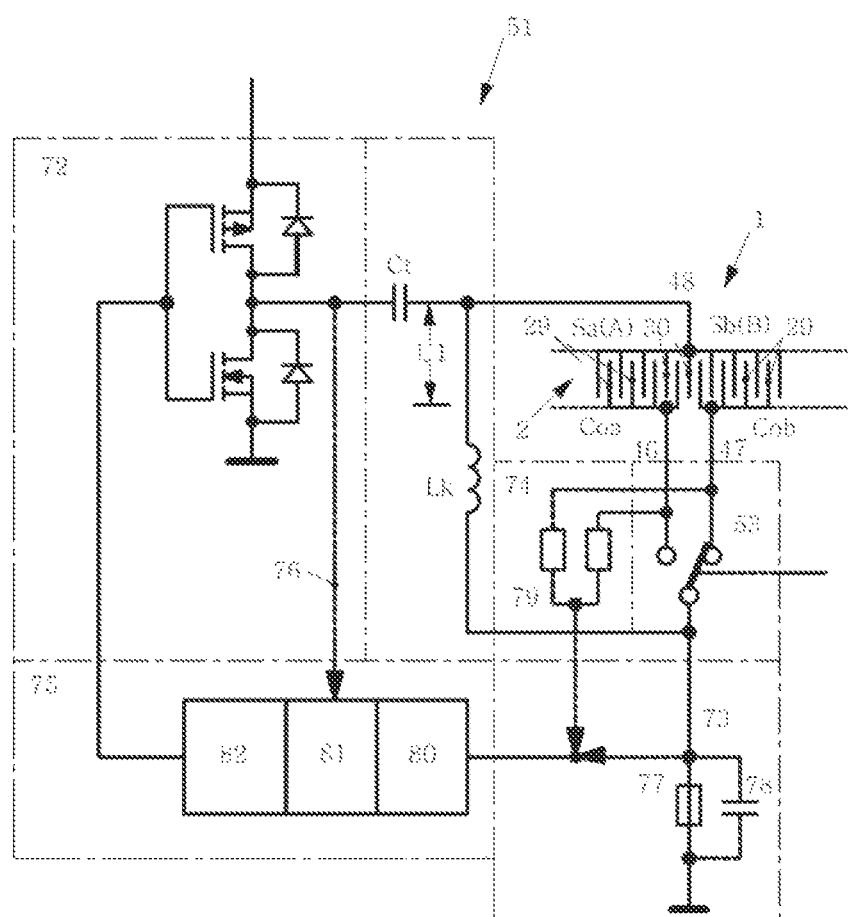
FIG. 15: Block diagram of a single-phase electric excitation device of the ultrasonic motor according to the invention.

FIG. 15 shows a simplified electric circuit of the single-phase electric excitation device 51. The circuit consists of the power amplifier 72, the feedback element 73 or 74, the feedback circuit 75, the phase chain 76, the compensating coil with the inductivity Lk and the decoupling capacitor with the capacity Ct.

The power amplifier 72 can be a linear amplifier or an impulse half-bridge amplifier, formed with bipolar transistors or with field effect transistors. For the feedback element 73 it is possible to use the low-impedance resistor 77, possibly with a capacitor 78 which is connected in parallel. As another element of the feedback circuit 74, it is possible to use a voltage divider 79 which is connected with the excitation electrodes 29 of sectors Sa and Sb.

The feedback circuit can comprise a filter 80, a phase detector 81 and a control generator 82. These links can be formed both as discrete elements and as programmable microprocessor.

A compensating coil having the inductivity Lk can be connected in parallel to the electrodes 29, 30 of the actuator 1. The magnitude of the inductivity of the compensating coil is determined from the condition $2\pi f0\ Lk = \frac{1}{2}\pi f0\ Co$. The value for Ct is selected such that it is considerably greater than the one for Co.

By employing the compensating coil having the inductivity Lk, it is possible to partially or completely compensate the capacitive component of the current of the electrodes of a sector group or of the two sector groups.

The circuit represented in FIG. 15 operates like a frequency controller f0 for the excitation voltage U1 of the actuator 1 after the phase signal of the element of the feedback circuit 73 or 74.

Figure 16:
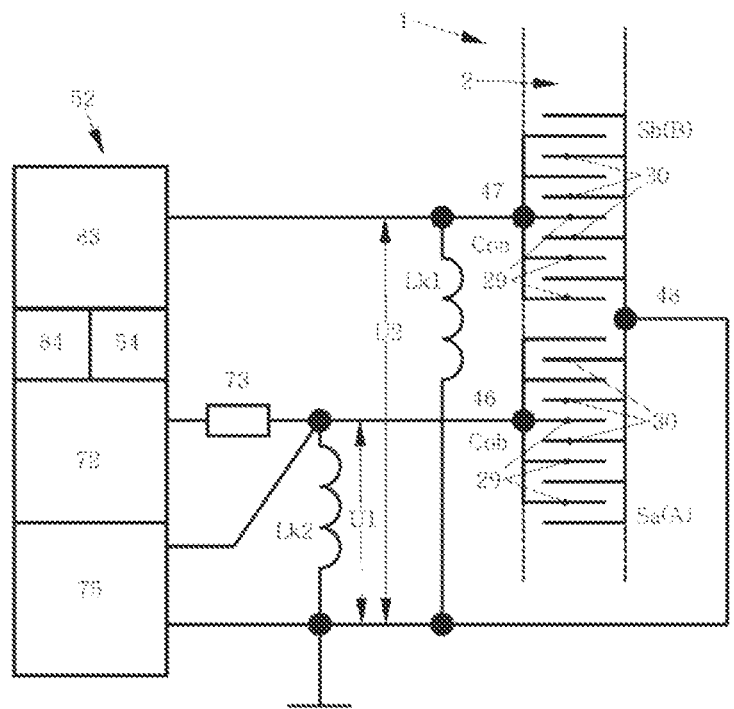
FIG. 16: Block diagram of a two-phase electric excitation device of the ultrasonic motor according to the invention.

FIG. 16 shows a simplified electric circuit of the two-phase electric excitation device 52.

The circuit comprises an additional power amplifier 83 formed as an analog amplifier. The amplifier is connected to the amplifier 72 via the phase shifter 84 and the phase commutator 54.

In the event of a two-phase excitation of the actuator 1, it is possible to use two compensating coils with the inductivities Lka and Lkb, that are connected in parallel to the electrodes 29 and 30 of sectors Sa and Sb of sector groups A and B.

Figure 17:
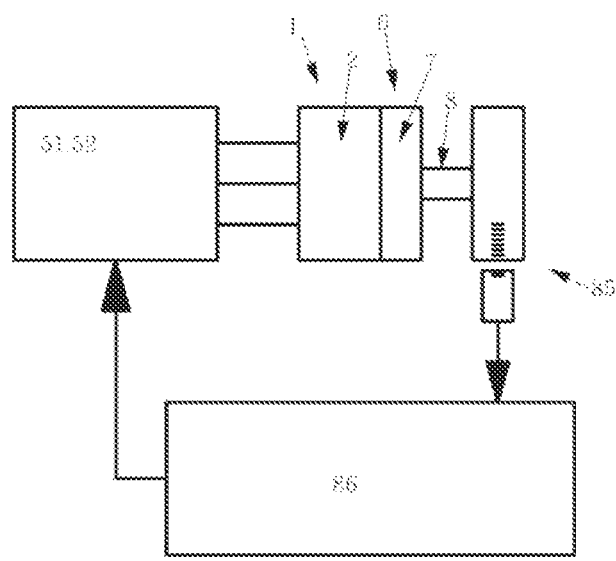
FIG. 17: Block diagram concerning an ultrasonic motor according to the invention comprising a position or speed indicator of the rotor on a controller for position and speed of the rotor.

According to FIG. 17, the ultrasonic motor according to the invention can be equipped with a position or speed indicator 85 of the rotor 6 and a controller for position and speed 86 of the rotor 6.

The invention claimed is:

1. Ultrasonic motor, comprising an ultrasound actuator having the form of a piezoelectric hollow cylinder comprising an inner circumferential surface and an outer circumferential surface as well as end faces connecting the inner and outer circumferential surfaces to each other, where friction elements are disposed on at least one end face, a rotor in effective contact with the friction elements comprising at least one disc or one platform, and an electric excitation device, wherein the ultrasound actuator is subdivided in the circumferential direction into an even number of sectors Sa and Sb having a mean length L of a sector in the circumferential direction, a height H of a sector in the axial direction and a thickness T of a sector in the radial direction, and respective two sectors Sa and Sb form a first sector group A and a second sector group B, wherein the sectors Sa and Sb of the respective two adjacent sector groups A and B alternate and are adjacent to each other, wherein in the region of the adjacent arrangement of neighboring sector groups A and B the friction elements are disposed, wherein each of the sectors Sa and Sb is formed by excitation electrodes and general electrodes arranged alternatingly in the axial direction of the hollow cylinder, wherein one layer of piezoelectric material is arranged between neighboring excitation electrodes and general electrodes, and wherein all the excitation electrodes which are related to the first sector group A are electrically connected to each other and to a first output of the electrodes to the electric excitation device, and all the excitation electrodes which are related to the second sector group B are electrically connected to each other and to a second output of the electrodes to the electric excitation device, and all the general electrodes of the ultrasound actuator are electrically connected to each other via connections to a third output to the electric excitation device, wherein the excitation electrodes and the general electrodes and the layers of piezoelectric material arranged between neighboring excitation electrodes and general electrodes of the sectors of a group of sectors form a generator for acoustic longitudinal standing waves, and the generators thus formed are electrically drivable such that a first longitudinal standing wave expands along a generatrix and thus along the circumferential direction of the ultrasound actuator, and a second longitudinal standing wave expands along the height of the ultrasound actuator.

2. Ultrasonic motor according to claim 1, wherein in that the excitation electrodes and the general electrodes and the layers of piezoelectric material arranged between neighboring excitation electrodes and general electrodes of the sectors of a group of sectors form a generator for an acoustic asymmetrical standing wave, and the generators thus formed are electrically drivable such that the acoustic asymmetrical standing waves expand along a generatrix and thus along the circumferential direction of the ultrasound actuator.

3. Ultrasonic motor according to claim 1, wherein the ratio L to H is between 1 and 1.3, and the ratio H to T is between 2 and 20.

4. Ultrasonic motor according to claim 1, wherein the rotor comprises damping elements which reduce the amplitude of parasitic oscillations of the rotor.

5. Ultrasonic motor according to claim 1, wherein the electric excitation device provides an electric single-phase excitation voltage, and the electric excitation device comprises a commutator for applying the single-phase excitation voltage to the excitation electrodes and the general electrode of either the first or the second sector group for reversing the direction of rotation of the rotor.

6. Ultrasonic motor according to claim 1, wherein the electric excitation device provides an electric two-phase voltage, wherein one of the voltages U1 and U2 thus provided is being applied to the excitation electrodes and the general electrodes of one sector group, and the second of the thus provided voltages is being applied to the excitation electrodes and the general electrodes of the other sector group, and the electric excitation device comprises a commutator for changing the phase shift between the provided voltages U1 and U2 for reversing the rotating direction of the rotor.

7. Ultrasonic motor according to claim 1, wherein compensation coils having an inductivity Lk are connected in parallel to the excitation electrodes and the general electrodes of a sector group or in parallel to the excitation electrodes and the general electrodes of both sector groups, which partially or completely compensate the capacitive component of the current of the electrodes of one sector group or of both sector groups.

8. Ultrasonic motor according to claim 1, wherein the electric excitation device comprises a feedback element that is connected in series with the electrodes of one of the sector groups.

9. Ultrasonic motor according to claim 8, wherein in that the electric excitation device comprises a feedback element that is connected in series with the electrodes of one of the sector groups and a feedback circuit for frequency regulation of the excitation voltage after the feedback element.

10. Ultrasonic motor according to claim 1, further comprising a position or speed indicator of the rotor and a controlling means for position and speed of the rotor.

* * * * *